United States Patent
Rothman et al.

(10) Patent No.: US 10,566,366 B2
(45) Date of Patent: Feb. 18, 2020

(54) PHOTODETECTION DEVICE HAVING A COATING COMPRISING TRENCHES WITH A WIDE BANDGAP COATING AND PRODUCTION METHOD

(71) Applicant: COMMISSARIAT A L'ENERGIE ATOMIQUE ET AUX ENERGIES ALTERNATIVES, Paris (FR)

(72) Inventors: Johan Rothman, Grenoble (FR); Florent Rochette, Saint-Jean de Bournay (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/777,722

(22) PCT Filed: Nov. 25, 2016

(86) PCT No.: PCT/EP2016/078792
§ 371 (c)(1),
(2) Date: May 21, 2018

(87) PCT Pub. No.: WO2017/089527
PCT Pub. Date: Jun. 1, 2017

(65) Prior Publication Data
US 2018/0374881 A1 Dec. 27, 2018

(30) Foreign Application Priority Data
Nov. 27, 2015 (FR) .................................. 15 61487

(51) Int. Cl.
*H01L 27/146* (2006.01)

(52) U.S. Cl.
CPC .... *H01L 27/1463* (2013.01); *H01L 27/14636* (2013.01); *H01L 27/14649* (2013.01); *H01L 27/14685* (2013.01)

(58) Field of Classification Search
CPC .............. H01L 27/146; H01L 27/1463; H01L 27/14649; H01L 27/14685; H01L 27/14636
(Continued)

(56) References Cited

U.S. PATENT DOCUMENTS 5,602,414 A 2/1997 Mitsui et al.
5,880,510 A 3/1999 Cockrum et al.
(Continued)

FOREIGN PATENT DOCUMENTS

WO WO 2005/101512 A2 10/2005

OTHER PUBLICATIONS

International Search Report dated Feb. 22, 2017, in PCT/EP2016/078792, filed Nov. 25, 2016.
(Continued)

*Primary Examiner* — Alexander O Williams
(74) *Attorney, Agent, or Firm* — Oblon, McClelland, Maier & Neustadt, L.L.P.

(57) ABSTRACT

A photodetection device including a diode array and a method for production thereof. In the device, each diode of the array includes an absorption region having a first bandgap energy and a collection region having a first doping type, and adjacent diodes in a network are separated by a trench including sides and a bottom. The bottom and sides of the trench form a stabilization layer having a second doping type, opposite the first doping type, and a bandgap energy greater than the first bandgap energy of the absorption regions.

11 Claims, 5 Drawing Sheets

(58) Field of Classification Search
USPC .......................................................... 257/446
See application file for complete search history.

(56) References Cited

U.S. PATENT DOCUMENTS

| | | | |
|---|---|---|---|
| 5,952,703 A | 9/1999 | Murakami et al. | |
| 7,936,034 B2 * | 5/2011 | Rothman | H01L 27/144 257/438 |
| 2005/0263805 A1 * | 12/2005 | Mouli | H01L 27/14609 257/292 |
| 2007/0158664 A1 | 7/2007 | Rothman | |
| 2009/0097522 A1 * | 4/2009 | Justice | H01S 5/18386 372/50.11 |
| 2012/0032218 A1 * | 2/2012 | Choi | H01L 33/08 257/98 |
| 2014/0326295 A1 * | 11/2014 | Moslehi | H02S 20/25 136/249 |
| 2016/0133779 A1 * | 5/2016 | Adachi | H01L 31/0747 438/66 |
| 2016/0381751 A1 * | 12/2016 | Bong | H05B 33/083 315/193 |
| 2017/0005121 A1 * | 1/2017 | Lenchenkov | H01L 27/1463 |

OTHER PUBLICATIONS

French Search Report dated Aug. 11, 2016, in FR 1561487, filed Nov. 27, 2015.

* cited by examiner

PHOTODETECTION DEVICE HAVING A COATING COMPRISING TRENCHES WITH A WIDE BANDGAP COATING AND PRODUCTION METHOD

TECHNICAL FIELD

The field of the invention is that of photodetectors comprising an array of diodes, such as a matrix array, manufactured on a semi-conductor substrate. The invention is more precisely concerned with p/n- or n/p-type diodes which can be used for visible or infrared imagers.

STATE OF PRIOR ART

In many photodetection applications, diodes are arranged as matrices of diodes on a substrate. In a matrix, the diodes are arranged in rows and columns. A matrix of diode can be used to enable an electromagnetic radiation to be detected. Indeed, electron-hole pairs can be formed by interaction between the electromagnetic radiation and the substrate. This enables a current proportional to an intensity of the incident radiation to appear. Each diode thereby forms a pixel of a photodetector.

By coupling the matrix of diodes with an electronic read circuit, it is thus possible to sense the spatio-temporal variation of light intensity on the photodetector. The sensitivity of such a photodetector is given by its ability to reflect small spatial or temporal variations of light intensity into a usable compared signal in spite of random variations (noise) resulting from thermal and electrical phenomena in the diodes and in the read circuit.

Such a matrix of diodes is illustrated in FIGS. 1a and 1b which represent a top view and a cross-section view respectively along a row of the matrix. A diode is formed in a substrate having an absorption layer 1 of a semi-conductor material with a forbidden energy gap and characterised by a type of conductivity. The diode comprises a collection region 2 of an opposite type of conductivity, thus forming a p-n junction.

As illustrated in FIG. 1b, each collection region is in contact with a metallic stud 3 forming a diode contact. A metal region 4, formed at the periphery of the matrix, is in contact with the substrate, and forms a substrate contact. Both regions of opposite type 1, 2 of conductivity are protected from a degradation in their chemical, mechanical, and electronic properties by means of a passivation layer 5 covering the surface of the substrate except for the diode contact and substrate contact zones.

In the region in the proximity of the interface of both regions of opposite type 1, 2 of conductivity, a so-called space charge region (SCR) is formed. This zone is characterised by the presence of an energy barrier for major carriers on each side of the junction. Photons arriving in the absorption layer 1 of the semi-conductor substrate can give their energy to one electron. If the electron passes between the valence band and the conduction band and is moved up to the space charge region, the charge will be collected by the collection region 2. The charges thus collected can be transferred to an electronic circuit, called a read circuit, connected to each diode to have a usable signal available. The charge drawing is compensated for by a call for charge by the substrate contact which is, in the case generally used in the state of the art, common for all diodes.

Upon detecting a high photon flux, each diode outputs a high charge flux, i.e. electric current, proportional to the photon flux arriving in the proximity of the diode. The currents of all the diodes are added through the substrate up to the substrate contact. In the presence of an electric resistance in the substrate, the current in the same can strongly influence the operation of the diodes.

This electric resistance can thus induce a polarization bias which affects the operation of the diodes. In the extreme case, it can cause a charge transfer cancellation between the diodes and the read circuit by removing the potential barrier in the junctions. This phenomenon is all the more significant that the number of diodes and the photon flux on the matrix are significant.

This electric resistance can beside strongly slowdown charge transfer in the read circuit, even in the presence of a small flux, because of a collective RC effect.

Besides, controlling the interface state between the passivation layer 5 and the semi-conducting regions 1, 2 is crucial to achieve a maximum sensitivity. This is due to faults which can be present at the interface, but also to states in the passivation which act as traps for charges. Faults at the interface can thus act as centres for generating/recombining carriers which decrease the photon signal and increase the contribution of the thermal or electric induced current generated in the substrate and/or in the junction. Trap states in the passivation are in turn likely to vary temporally the local charge density in the proximity of each trap. These fluctuations can in turn generate fluctuations in the photon current and in the different dark currents.

Another source of temporal variation in the performance of the diodes corresponds to faults present in the materials, such as dislocations or atom complexes which generate energy states in the bandgap. The influence of these faults depends on their location and their electrical environment. The presence of these faults is not necessarily unacceptable, but a modulation in their location and/or their electrical environment is highly likely to modulate the performance of the diodes by inducing sensitivity variations and/or an increase in the number of faulty diodes. In particular, the detrimental influence of these faults significantly increases when the operating temperature of the photodetector increases. For example, the accessible temperature range for photodetectors operating in the infrared is nowadays limited to about 160 K. Beyond this temperature, the faulty condition becomes unacceptable for a proper operation of a high performance photodetector.

Another important characteristic for the performance of a photodetector is the ability to collect photo-carriers generated in a pixel in the same pixel, without inducing a signal on the neighbouring pixels (electro-optical crosstalk problem). This characteristic, measured by the point spread function (PSF), is crucial to make imagers with reduced size and pixel pitch. In an imager made according to the state of the art, the charges are collected by diffusion (random walk) and the PSF is degraded when the pixel pitch moves closer to the thickness of the absorption layer.

A technique enabling this crosstalk to be reduced consists in ensuring physical separation of the pixels by etching trenches about the pixels. In this case, each pixel forms a mesa. From patent application WO 2005/101512 A2, an etching of trenches is known in a collecting layer which rests on an absorption layer, the trenches extending down to the absorption layer and the flanks of the trenches having a conductivity type opposite to the conductivity type of the conducting layer to control the electrical properties thereof. The array of pixels is however sensitive to the presence of a metallisation and/or to faults present at the surface, and can thus have (fluctuating) noise faults.

DISCLOSURE OF THE INVENTION

To that end, the invention provides a photodetection device with an array of diodes, wherein each diode of the array includes an absorption region carried by a substrate and which has a first bandgap energy. Each diode of the array further includes a collection region which has a first doping type. The adjacent diodes in the array are separated by a trench including flanks and a bottom which delimit an internal face of the trench on the substrate side and an external face of the trench. A stabilization layer is present along the internal face of the trench. The stabilization layer has a second doping type opposite to the first doping type and a bandgap energy higher than the first bandgap energy of the absorption regions.

Some preferred but non-limiting aspects of this device are the following ones:
- the second doping type is a P type doping;
- a trench separates the absorption regions from the adjacent diodes and is devoid of contact with the collection regions of the adjacent diodes;
- the absorption regions of the diodes rest on an intermediate layer which has a same doping type and a same doping level as the absorption regions and a bandgap energy higher than the first bandgap energy of the absorption regions;
- the stabilization layer extends through at least one part of the intermediate layer;
- it further includes a passivation layer which covers each diode except for contact regions of an electrically conductive stud with a collection region of a diode;
- the stabilization layer extends from the flanks of the trench on a given distance underneath the passivation layer;
- each diode further comprises a region located above the absorption region which has a same doping type as the absorption region and a bandgap energy higher than that of the absorption region;
- the absorption region of a diode has a doping level lower than $5 \cdot 10^{16}$ at/cm$^3$;
- the external face of a trench is covered with a metallisation layer.

The invention also relates to a method for manufacturing a photodetection device including an array of diodes, wherein each diode of the array includes an absorption region carried by a substrate, and which has a first bandgap energy, as well as a collection region which has a first doping type. The method comprises forming trenches separating the adjacent diodes in the array, each trench including flanks and a bottom which delimit an internal face of the trench on the substrate side and an external face of the trench. The method comprises a step of forming a stabilization layer along the internal face of a trench, the stabilization layer having a second doping type opposite to the first doping type and a bandgap energy higher than the first bandgap energy of the absorption regions. The step of forming the stabilization layer can in particular comprise transforming the bottom and the flanks of a trench by implanting and diffusing an impurity.

BRIEF DESCRIPTION OF THE DRAWINGS

Further aspects, purposes, advantages and characteristics of the invention will better appear upon reading the following detailed description of preferred embodiments thereof, given by way of non-limiting example, and made in reference to the appended drawings in which.

DETAILED DISCLOSURE OF PARTICULAR EMBODIMENTS

Figure 2A:
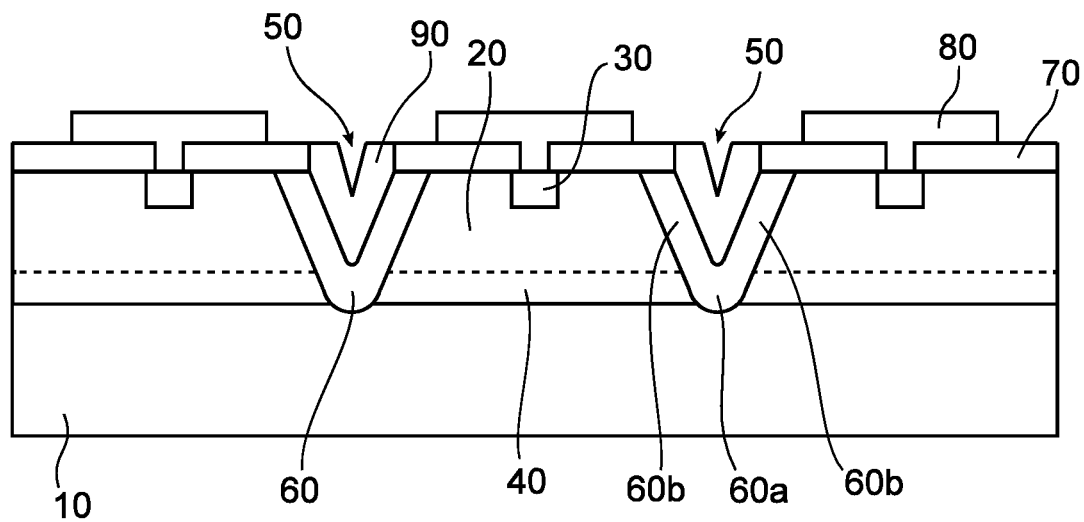
FIGS. 2a and 2b are respectively a cross-section view and a top view along a row of diodes of a matrix of diodes in accordance with the invention.
Figure 2B:
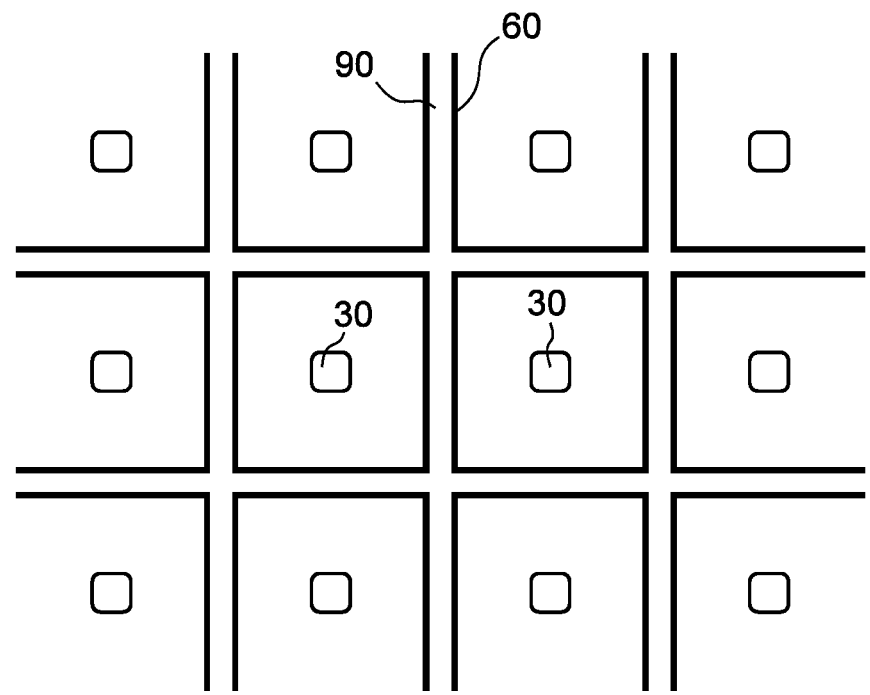

In reference to FIGS. 2a and 2b, the invention is concerned with a photodetection device including a substrate 10 transparent to light in the detection spectral range of the device and an array of diodes. Each diode comprises an absorption region 20 carried by the substrate 10 and which has a bandgap energy adapted for the detection spectral range. Each diode comprises furthermore, in the absorption region 20, a collection region 30 which has a first doping type, for example a N type doping, with a doping level typically higher than $5 \times 10^{16}$ at/cm$^3$.

The absorption regions 20 result for example from an absorption layer, for example of CdHgTe. Such a layer may in particular have been formed by epitaxy on a substrate 10 of CdZnTe. Its cadmium composition can be between 20 and 40%. Its thickness is for example between 2 and 6 µm.

The absorption regions 20 are preferably of the N type. But, they can also be of the P type. Their doping level is for example between $1 \times 10^{14}$ and $5 \times 10^{16}$ at/cm$^3$.

In one possible embodiment, the absorption regions 20 of the diodes rest on an intermediate layer 40 itself formed by epitaxy at the surface of the substrate 10. The intermediate layer 40 has a same doping type and a same doping level as the absorption regions 20 and a bandgap energy higher than that of the absorption regions, typically obtained by means of a cadmium composition higher than that of the absorption regions. The cadmium composition of the intermediate layer 40 can be constant or be in accordance with a composition gradient according to which the cadmium composition decreases up to reach the absorption regions 20. The thickness of the intermediate layer 40 is for example between 1 and 2 µm.

Still in reference to FIGS. 2a and 2b, in the array of diodes, the adjacent diodes are separated by a trench 50 which includes flanks and a bottom connecting the flanks. The trenches thus define pixels in the form of a mesa. They form a grid (in the case of a matrix array, a grid of rows and columns which extend up to the periphery of the matrix) that separates each of the adjacent diodes. As represented in FIG. 2a, a trench 50 separates the absorption regions 20 of adjacent diodes and is devoid of contact with the collection regions 30 of the adjacent diodes. The flanks and bottom of a trench delimit an internal face of the trench on the substrate side and an external face of the trench.

Within the scope of the invention, there is a stabilization layer 60 along the internal face of the trenches. The stabilization layer 60 has a second doping type opposite to the first doping type of the collection regions 30. The second doping type can thus be a P type. It is furthermore provided that the stabilization layer 60 has a bandgap energy higher than that of the absorption regions.

In such a device, the presence of the trenches defines an energy local minimum for faults associated with a deformation of the crystal lattice, such as dislocations and atomic aggregates. The presence of this kind of faults, formed upon manufacturing or using the device (thermal cycling of the finished product), is thus more probable in the region at the bottom of the trenches. The formation of the stabilization region with a high bandgap energy in this bottom region enables the amplitude of fluctuations associated with these faults on the performance of the photodetector to be reduced, and thus, allows a performance stabilization because of the reduced number of noise faults There is also the stabilization layer 60 along the flanks of a trench. The stabilization layer thus comprises a portion 60a at the bottom of the trenches and portions 60b along the flanks of the trenches. The extension of the stabilization layer along the flanks of the trenches reduces, by the same effect as that previously set out, the impact of faults generated upon forming the trenches The stabilization layer 60 can result from transforming the flanks and the bottom of a trench, made by incorporating (for example implanting) and diffusing an impurity (of the acceptor type in case of a P type doping, for example arsenic) capable of resulting in obtaining a region with a bandgap energy higher those that of the absorption regions, for example by promoting inter-diffusion between cadmium and mercury atoms in a layer of CdHgTe.

The geometry of the flanks of a trench is preferably adapted to facilitate impurity incorporation. In the case of an implantation of the impurity, this geometry is preferably characterised by tilted flanks. The bottom of the trenches can in turn be pointed, rounded or rectangular.

Taking the example of an N type collection layer and a P type stabilization layer, an N/x/P junction is formed in each diode.

When the absorption regions have a n type doping, each diode has a p-n junction located at the interface between the absorption region 20 and the stabilization layer 60 on the flanks of the trench 50 separating said absorption region from the absorption region of the adjacent diode.

When the absorption regions have a p type doping, each diode has a p-n junction located at the interface between the collection region 30 and the absorption region 20.

In a favoured embodiment of the invention, the stabilization layer 60 extends through at least one part of the intermediate layer 40 underlying the absorption regions 20 and with a bandgap energy higher than that of the absorption regions 20. In the same way, the photo-carriers generated in the absorption region of a diode are contained in the same and cannot diffuse to the adjacent diode from which it is separated by the trench 50. This containment limits electro-optical crosstalk and this embodiment is thus amenable to making photodetectors with a small pixel pitch. In the example of FIG. 2a, the stabilization layer 60 passes fully through the intermediate layer 40 up to opening into the substrate 10.

Figure 1A:
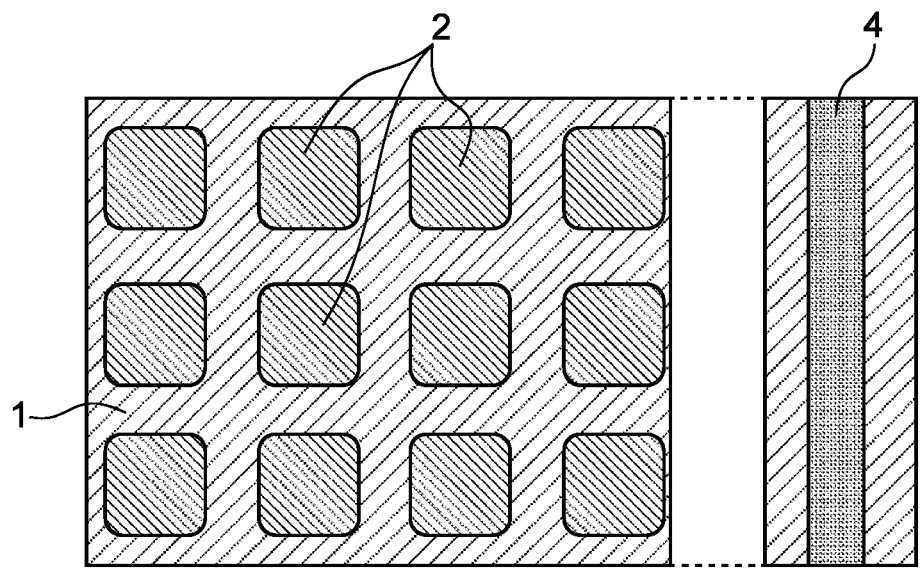
FIGS. 1a and 1b represent a top view and a cross-section view respectively along a row of the matrix of a known device.
Figure 1B:
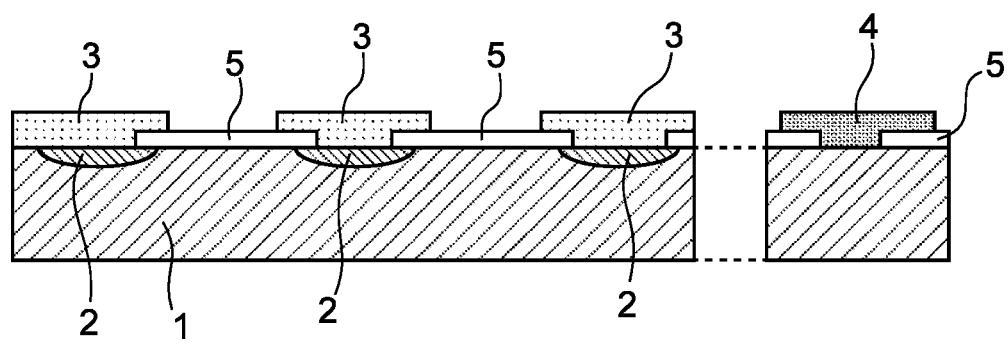

The device according to the invention can furthermore include a peripheral substrate contact arranged on at least one side of the array of diodes. This contact is not represented in FIGS. 2a and 2b but is similar to that previously discussed in connection with FIGS. 1a and 1b. Such a peripheral substrate contact enables an electrical connection between the substrate and the read circuit to be made on the periphery of the array of diodes thus releasing room between diodes, and advantageously enabling an array of diodes to be made with a small pitch between diodes.

As represented in FIG. 2a, the device further comprises a passivation layer 70 which covers the array of diodes except for the trenches 50, contact regions of an electrically conductive stud 80 with a collection region 30 of a diode, and optionally a peripheral contact region of an electrically conducting stud with the substrate.

The diodes are thus protected against a degradation which can be of the mechanical, chemical and electrical origin by the passivation layer 70. The passivation is locally open above the collection regions 30 to enable metallic contacts 80 to be formed in these regions. It can also, but not necessarily, be opened above the stabilization layer 60 of the trenches 50 to enable a metallic contact 90 to be formed therein.

The studs 80 are located above the collection regions 30 of each pixel. These diode contacts 80 enable an individual electrical connection of each diode to be made with an electronic read circuit which is capable of assembling the information from each pixel.

As represented in FIGS. 2a and 2b, each stabilization layer 60 of a trench can be covered with a metallisation layer 90. This metallisation formed on the external face of the trench, in contact with the stabilization layer, is distributed in and on the flanks of the trenches up to the periphery of the matrix as represented in FIG. 2b. In an alternative embodiment, since the continuity of the substrate contact is ensured by the stab on stabilization layer 60, the metallisation 90 can have a broken continuity with the substrate contact by not covering the stabilization layer by the metallisation 90 in some places, for example at each inter-pixel region (at each crossing of a row and a column in FIG. 2b). The interest of this alternative is to relieve mechanical stresses induced by a metallisation deposition, these stresses possibly resulting in generating structural faults and thus leading to noise and additional parasitic current. The performance stability as well as the performance itself are thus improved.

Figure 3:
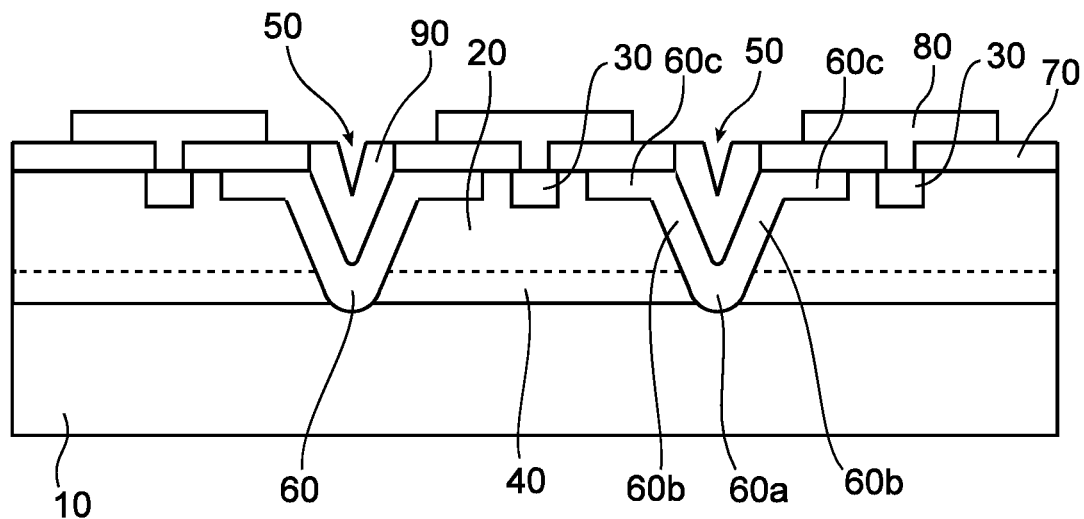
FIGS. 3 and 4 illustrate alternative embodiments of the invention.

In another alternative embodiment represented in FIG. 3, the stabilization layer 60 extends from the flanks of the trench over a given distance underneath the passivation layer 70. In other words, the stabilization layer 60 also comprises portions 60c extending under the passivation layer 70 from the upper part of the portions 60b formed along the flanks of a trench. These portions 60c are dimensioned so as not to contact a collection region 30, by being separated by a distance of at least 0.5 µm. This alternative enables the influence of faults located in and in the proximity of the passivation layer 70 on the performance stability to be reduced.

Figure 4:
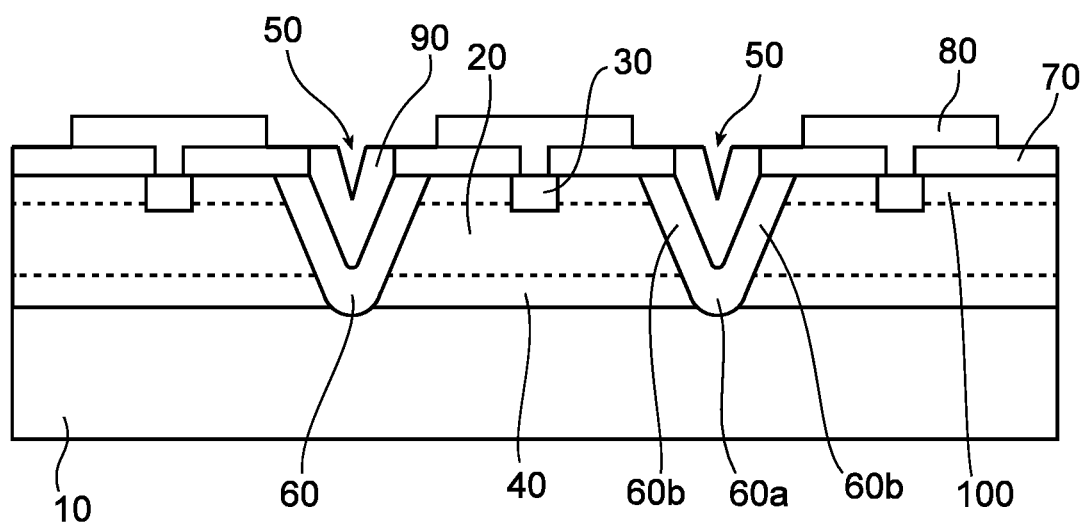

In another alternative embodiment represented in FIG. 4, compatible with that of FIG. 3, each diode further comprises a region 100 located above the absorption region 20 which has a same doping type as the absorption region and a bandgap energy higher than that of the absorption region. This increase in the bandgap energy above the absorption region 20 under the passivation layer enables the influence of faults on the electro-optical performance to be reduced and thus the performance stability of each pixel to be improved. In the case of a doping of the opposite type of the absorption layer 20 and the collection region 30, it is preferable that the collection region 30 projects from this region 100 with a high bandgap to be in contact with the absorption region 20.

The combination of both alternatives set out below enables, in addition of an improvement in the performance stability, the generation of a tunneling current in the zone between the stabilization layer 60 and the collection region 20 to be reduced, making it possible to access more significant inverse biases.

It will be noticed that both these alternatives are particularly advantageous for applications with a high operating temperature of the photodetector (called HOT for "High Operating Temperature").

In another alternative embodiment, the regions 20, and possibly regions 40 and 100, have a small doping level, typically lower than $1\times10^{15}$ at/cm$^3$. Most of the volume of these regions is thereby depleted for small reverse bias values, typically lower than 1 to 2 V. This alternative enables the contribution of diffusion currents to the dark current to be removed, which will be limited to the so-called GR (Generation-Recombination) current, generated on the faults present on the space charge region (SCR) upon applying the reverse bias. In addition, this alternative enables the collection time of the photo-carriers to be reduced, which promotes obtaining a stabilised photon sensitivity.

The invention is not limited to the photodetection device previously described, but is also applicable to a method for manufacturing a photodetection device including an array of diodes, wherein each diode of the array includes an absorption region which has a first bandgap energy and a collection region which has a first doping type. The method comprises forming a trench separating the adjacent diodes in the array, and a step of transforming the bottom and the flanks of a trench into a stabilization layer having a second doping type opposite to the first doping type and a bandgap energy higher than the first bandgap energy of the absorption regions.

FIGS. 5a-5e illustrate an exemplary embodiment of such a method which starts (FIG. 5a) with a step of providing a substrate 10 carrying the intermediate layer 40 and the absorption layer 20.

Figure 5A:
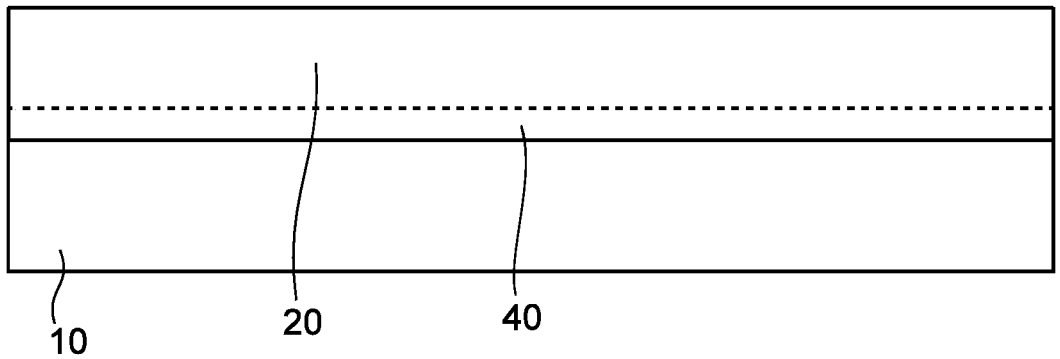
FIGS. 5a-5e illustrate a possible embodiment of a method for manufacturing a photodetection device in accordance with the invention.
Figure 5B:
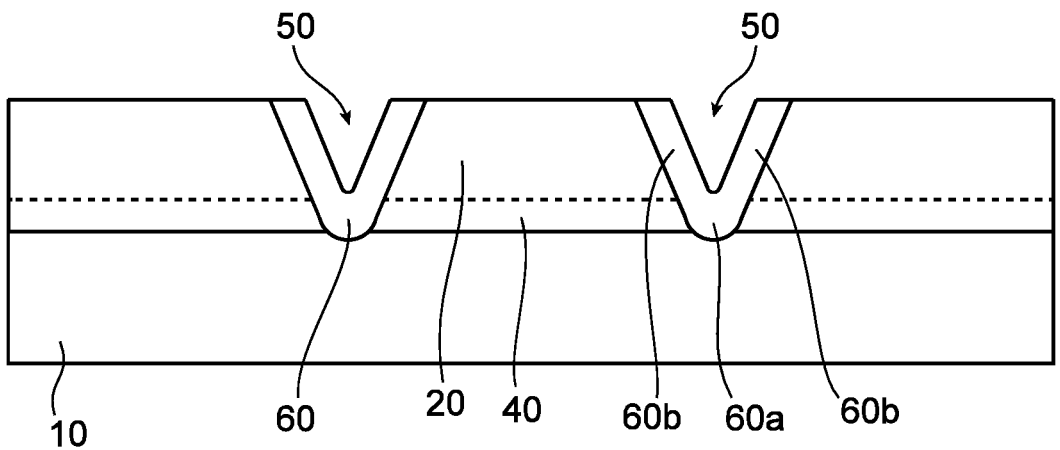

In reference to FIG. 5b, there is then the process of etching the trenches 50 forming a grid delimiting the collection region of the carriers of each of the diodes. Etching is deep enough for the impurity implanted in the next step to be able to diffuse up to the intermediate layer 40. Etching is typically made up to reach the intermediate layer 40, or is stopped at not more than 1 μm from the interface between the absorption layer 20 and the intermediate layer 40. Thereby, the trenches extend in the absorption layer to separate absorption regions therefrom.

Still in reference to FIG. 5, a process of implanting an acceptor type impurity, preferably As, and then activation annealing and diffusing this acceptor type impurity is performed. Resorting to a dopant element, such as As or Sb, promotes Cd inter-diffusion between the regions in order to form the stabilization layer with a P type dope and a bandgap higher than the absorption layer 40.

Figure 5C:
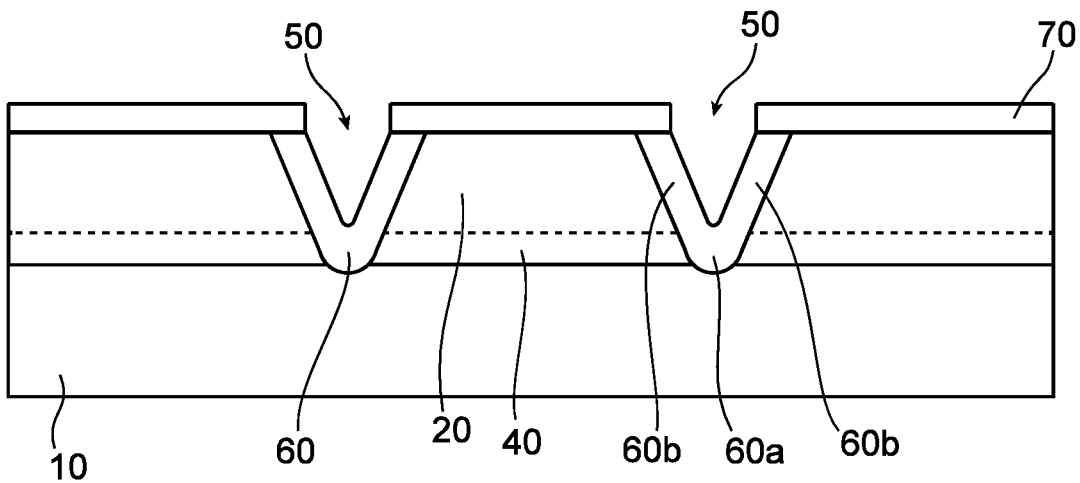

In reference to FIG. 5c, the deposition of a passivation layer 70 is made.

Figure 5D:
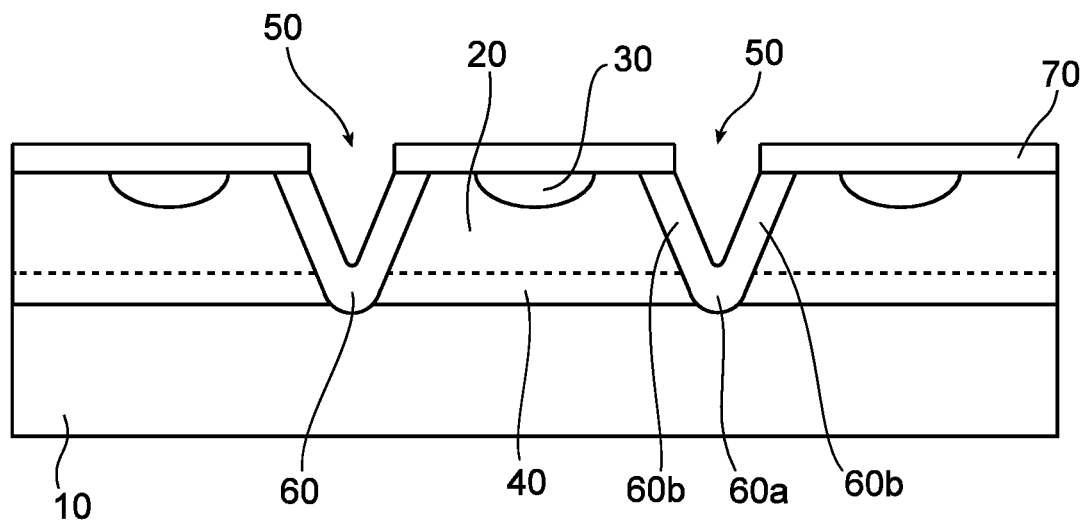
Figure 5E:
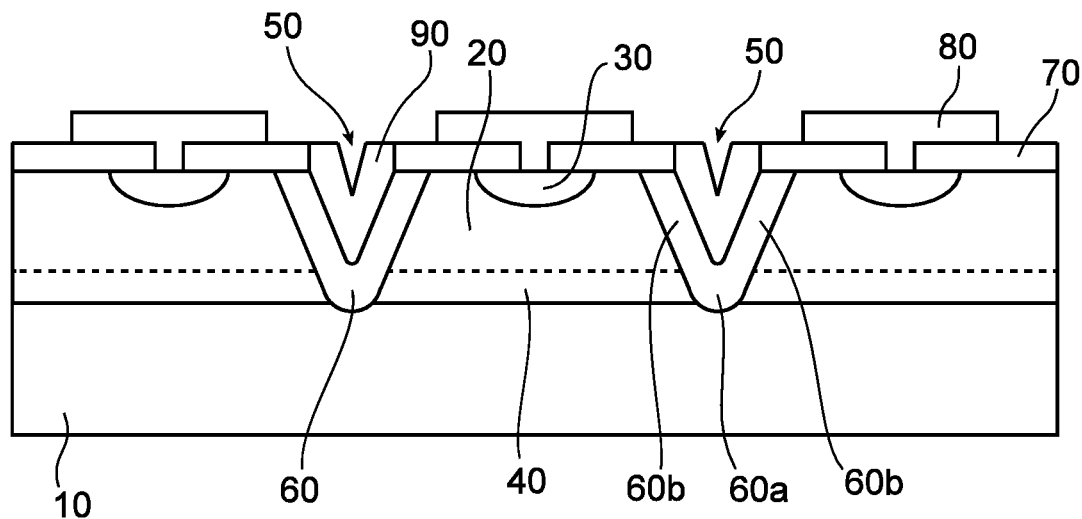

An Hg saturation vapour pressure annealing is then implemented in order to remove Hg vacancies. This annealing enables a cadmium inter-diffusion to be made in the passivation layer 70 and the stabilization layer 60. It is for example made at a temperature higher than 400° C. for more than one hour As represented in FIG. 5d, the formation of a collection region 30 with a high N+ doping, for example boron implantation, is made in the centre of each pixel.

The opening of the passivation at the periphery of the matrix of photodiodes, at the trenches and in the centre of each pixel is then made, and then the deposition of a metal layer and its etching to maintain it at each pixel, at the peripheral substrate contact and at each trench are made. The remaining metal thickness is typically lower than 1 μm.

The invention is advantageously applicable in the following cases:
imaging requiring a quick boot or a continuous use without re-calibration other than that made in factory;
imaging with a high operating temperature, by virtue of the reduction in the number of noise faults and in the reduction in the dark current;
full-size imaging, the metallised grid enabling actually an n/P structure to be obtained with a very low depolarisation effect;
imaging with a small pixel pitch, by removing diffusion crosstalk of the carriers between the pixels.

The invention can moreover be used with an optical concentration device to favour obtaining a maximum quantum yield. In this case, the volume of the absorption region can be minimised in order to reduce the dark current and to improve the sensitivity and/or increase the operating temperature of the detector.

The invention claimed is:

1. A photodetection device comprising:
a plurality of diodes arranged in an array of diodes, wherein each of said diodes includes:
an absorption region having a first bandgap energy in an absorption layer supported by a substrate,
a collection region which has a first doping type, and
a contact region of an electrically conductive stud with the collection region,
wherein trenches separate adjacent diodes in the array of diodes, each of said trenches comprising flanks and a bottom that result from etching the absorption layer and which delimit an internal face of the trench on the substrate side and which delimit an external face of the trench,
wherein a passivation layer covers the array of diodes except for the trenches and the contact region of each of said diodes,
wherein a stabilization layer is arranged along the internal face of each of said trenches, the stabilization layer resulting from a transformation of the flanks and the bottom of each of said trenches made by incorporating and diffusing an impurity, the stabilization layer having a second doping type opposite to the first doping type and a bandgap energy higher than the first bandgap energy.

2. The photodetection device according to claim 1, wherein the second doping type is a P type doping.

3. The photodetection device according to claim 1, wherein each of said trenches that separates adjacent diodes in the array separates the absorption regions of the adjacent diodes and is devoid of contact with the collection regions of the adjacent diodes.

4. The photodetection device according to claim 1, wherein the absorption regions of each of said diodes rest on an intermediate layer which has a same doping type and a same doping level as the absorption region of each of said diodes and a bandgap energy higher than the first bandgap energy.

5. The photodetection device according to claim 4, wherein the stabilization layer arranged along the internal face of each of said trenches extends through at least one part of the intermediate layer.

6. The photodetection device according to claim 1, wherein the stabilization layer extends from the flanks of each of said trenches on a given distance underneath the passivation layer.

7. The photodetection device according to claim 1, wherein each of said diodes further comprises, on an opposite side to the substrate, a region located above the absorption region which has a same doping type as the absorption region and a bandgap energy higher than that of the absorption region.

8. The photodetection device according to claim 1, wherein the absorption region of each of said diodes has a doping level lower than $5*10^{16}$ at/cm$^3$.

9. The photodetection device according to claim 1, wherein the external face of each of said trenches is covered with a metallization layer.

10. The photodetection device according to claim 9, wherein the metallization layer that covers the external face of each of said trenches is in electric contact with a peripheral substrate contact arranged on at least one side of the array of diodes.

11. A method for manufacturing a photodetection device including a plurality of diodes arranged in an array of diodes, wherein each of said diodes includes an absorption region having a first bandgap energy in an absorption layer supported by a substrate, a collection region which has a first doping type, and a contact region of an electrically conductive stud with the collection region, the method comprising:
- forming trenches separating adjacent diodes in the array of diodes, each of said trenches including flanks and a bottom which result from etching the absorption layer and which delimit an internal face of the trench on the substrate side and an external face of the trench;
- forming a passivation layer which covers the array of diodes except for the trenches and the contact region of each of said diodes;
- forming a stabilization layer along the internal face of each of said trenches which comprises transforming the bottom and the flanks of each of said trenches by incorporating and diffusing an impurity, the stabilization layer having a second doping type opposite to the first doping type and a bandgap energy higher than the first bandgap energy.

* * * * *